(12) United States Patent
Zhang et al.

(10) Patent No.: US 11,107,697 B2
(45) Date of Patent: Aug. 31, 2021

(54) FLOATING GATE FABRICATION METHOD

(71) Applicant: WUHAN XINXIN SEMICONDUCTOR MANUFACTURING CO., LTD., Hubei (CN)

(72) Inventors: Chaoran Zhang, Hubei (CN); Jun Zhou, Hubei (CN); Yun Li, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 245 days.

(21) Appl. No.: 16/210,392

(22) Filed: Dec. 5, 2018

(65) Prior Publication Data

US 2019/0363096 A1 Nov. 28, 2019

(30) Foreign Application Priority Data

May 28, 2018 (CN) .......................... 201810523457.9

(51) Int. Cl.
*H01L 21/324* (2006.01)
*H01L 21/225* (2006.01)
(Continued)

(52) U.S. Cl.
CPC ........ *H01L 21/324* (2013.01); *H01L 21/2253* (2013.01); *H01L 21/3212* (2013.01); *H01L 27/11517* (2013.01); *H01L 21/76229* (2013.01)

(58) Field of Classification Search
CPC ............ H01L 21/76229; H01L 21/324; H01L 21/2253; H01L 21/11517; H01L 21/76868;
(Continued)

(56) References Cited

U.S. PATENT DOCUMENTS 5,989,956 A * 11/1999 Huang .............. H01L 27/10852
257/E21.648
6,436,749 B1 * 8/2002 Tonti ............... H01L 21/823842
257/E21.637
(Continued)

FOREIGN PATENT DOCUMENTS

CN 101399191 A 4/2009
CN 101465383 A 6/2009
(Continued)

*Primary Examiner* — Zandra V Smith
*Assistant Examiner* — Abbigale A Boyle
(74) *Attorney, Agent, or Firm* — Muncy, Geissler, Olds & Lowe, P.C.

(57) ABSTRACT

A floating gate fabrication method is disclosed. The method includes: providing a substrate, and depositing an oxide layer on the substrate; fabricating a shallow trench isolation in the substrate, a top surface of the shallow trench isolation being higher than a top surface of the oxide layer; depositing a polysilicon layer on the oxide layer and the shallow trench isolation; performing a first thermal annealing process on the polysilicon layer, thereby repairing cavities formed after the deposition of the polysilicon layer; implanting ions into the polysilicon layer; performing a second thermal annealing process on the polysilicon layer, thereby activating the implanted ions and repairing again the cavities formed after the deposition of the polysilicon layer; and planarizing the polysilicon layer to form a floating gate.

11 Claims, 4 Drawing Sheets

(51) Int. Cl.
*H01L 21/321* (2006.01)
*H01L 27/11517* (2017.01)
*H01L 21/762* (2006.01)

(58) Field of Classification Search
CPC ....... H01L 21/28176; H01L 21/823437; H01L 21/823828; H01L 29/42324; H01L 29/42336
See application file for complete search history.

(56) References Cited

U.S. PATENT DOCUMENTS

| | | | |
|---|---|---|---|
| 6,794,241 B2 * | 9/2004 | Kim | H01L 21/31604 438/240 |
| 6,838,342 B1 * | 1/2005 | Ding | H01L 27/115 438/257 |
| 6,897,284 B2 | 5/2005 | Liu et al. | |
| 10,579,852 B2 * | 3/2020 | Li | G06K 9/0004 |

FOREIGN PATENT DOCUMENTS

| | | |
|---|---|---|
| CN | 102732941 A | 10/2012 |
| CN | 104425226 A | 3/2015 |
| CN | 105624794 A | 6/2016 |

* cited by examiner

FLOATING GATE FABRICATION METHOD

CROSS-REFERENCE TO RELATED APPLICATION

This application claims the priority of Chinese patent application number 201810523457.9, filed on May 28, 2018, the entire contents of which are incorporated herein by reference.

TECHNICAL FIELD

The present invention relates to the field of semiconductor manufacturing technologies, and in particular, to a floating gate fabrication method.

BACKGROUND

In a floating-gate memory, a floating gate is formed by successively performing polysilicon deposition, ion-implantation doping, rapid thermal annealing, and chemical mechanical polishing. The floating gate highly affects the performance of a flash memory, and may directly affect quality and reliability of a device. Therefore, a defect that would affect the quality and reliability is not allowed to occur in the fabricated floating gate.

In the prior art, referring to FIG. 1, a conventional method for fabricating a floating gate includes the following steps: step 1, providing a substrate 110; step 2, performing photolithography and dry etching on the substrate 110 to form a trench, filling the trench with oxide, and forming a shallow trench isolation 120 by chemical mechanical polishing; step 3, depositing an oxide layer 130 on the substrate 110; step 4, depositing polysilicon 140 on the oxide layer 130; afterwards, continue referring to FIG. 2, step 5, implanting ions into the deposited polysilicon 140, and carrying out rapid thermal annealing; and finally, referring to FIG. 3, grinding the polysilicon by chemical mechanical polishing to achieve a desired height, so as to form the floating gate. Due to reduction of the size of the flash memory and limitation on the shape of the shallow trench isolation 120, cavities 150 are probably formed after deposition of the polysilicon 140, and cannot be completely repaired in the subsequent conventional annealing process. Moreover, the cavities 150 are more likely to occur in the polysilicon as the floating gate is reduced in size, causing a defect in the polished floating gate and finally affecting the reliability and storage function of the device.

SUMMARY OF THE INVENTION

An objective of the present invention is to provide a floating gate fabrication method, so as to repair cavities formed after polysilicon deposition, reduce defects in a polished floating gate, and improve the reliability of a device.

To achieve the foregoing objective, the present invention provides a floating gate fabrication method, which includes:
providing a substrate, and depositing an oxide layer on the substrate;
fabricating a shallow trench isolation in the substrate, a top surface of the shallow trench isolation being higher than a top surface of the oxide layer;
depositing a polysilicon layer on the oxide layer and the shallow trench isolation;
performing a first thermal annealing process on the polysilicon layer, thereby repairing cavities formed after the deposition of the polysilicon layer;
implanting ions into the polysilicon layer;
performing a second thermal annealing process on the polysilicon layer, thereby activating the implanted ions and repairing again the cavities formed after the deposition of the polysilicon layer; and
planarizing the polysilicon layer to form a floating gate.

Alternatively, in the floating gate fabrication method, the step of fabricating a shallow trench isolation includes:
depositing an auxiliary layer on the surface of the oxide layer;
dry etching the auxiliary layer, the oxide layer, and the substrate to form a trench, filling the trench with oxide, and then planarizing the oxide by chemical mechanical polishing; and
removing the auxiliary layer to form the shallow trench isolation.

Alternatively, in the floating gate fabrication method, the oxide layer deposited on the substrate includes silicon oxide.

Alternatively, in the floating gate fabrication method, the oxide layer deposited on the substrate has a thickness of 80 to 120 angstroms.

Alternatively, in the floating gate fabrication method, the step of depositing a polysilicon layer comprises: depositing the polysilicon layer by chemical vapor deposition at a temperature of 600° C. to 650° C.

Alternatively, in the floating gate fabrication method, the first thermal annealing process and the second thermal annealing process are both performed in a nitrogen gas atmosphere at a temperature of 1000° C. to 1080° C.

Alternatively, in the floating gate fabrication method, the first thermal annealing process and the second thermal annealing process are both performed for 20 to 30 seconds.

Alternatively, in the floating gate fabrication method, the ions implanted into the polysilicon layer include phosphonium ions.

Alternatively, in the floating gate fabrication method, the polysilicon layer has a doping concentration of $1E15/cm^2$ to $5E15/cm^2$ after implantation of the phosphonium ions.

Alternatively, in the floating gate fabrication method, the polysilicon layer is planarized until a top surface of the polysilicon layer levels with the top surface of the shallow trench isolation.

Alternatively, in the floating gate fabrication method, the floating gate has a height of 200 to 600 angstroms after the planarization.

In the floating gate fabrication method provided by the present invention, the thermal annealing is performed for the first time after deposition of the polysilicon layer, and the cavity formed in the polysilicon layer can be repaired by the first thermal annealing step. Then, the thermal annealing is performed for the second time after ion implantation. The second thermal annealing step not only can activate the implanted ions, but also can further repair the cavity in the polysilicon layer. Finally, the cavity in the polysilicon layer can be completely repaired after the two thermal annealing steps, thus lowering the occurrence likelihood of a defect in the polished floating gate, and improving the reliability and storage function of a device.

Description of the numerals: 110-Substrate, 120-Shallow trench isolation, 130-Oxide layer, 140-Polysilicon, 150-Cavity, 210-Substrate, 220-Shallow trench isolation, 230-Oxide layer, 240-Polysilicon, 250-Cavity.

DETAILED DESCRIPTION OF EXEMPLARY EMBODIMENTS

Specific embodiments of the present invention will be described in detail below with reference to the accompanying drawings. Advantages and features of the present invention will be more apparent from the description and appended claims. It should be noted that the accompanying drawings are in a very simplified form and all use non-precise proportions, and are only used to conveniently and clearly describe the embodiments of the present invention.

Figure 1:
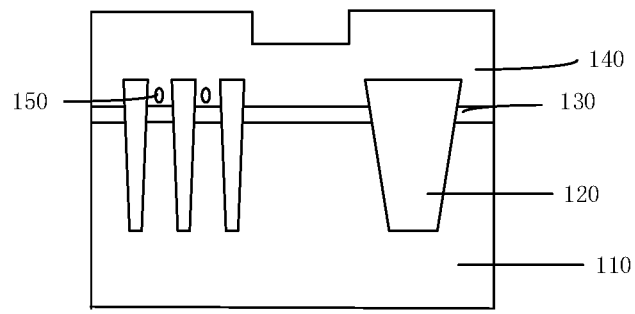
FIG. 1 to FIG. 3 are schematic cross-sectional diagrams of a floating gate fabrication method in the prior art.
Figure 2:
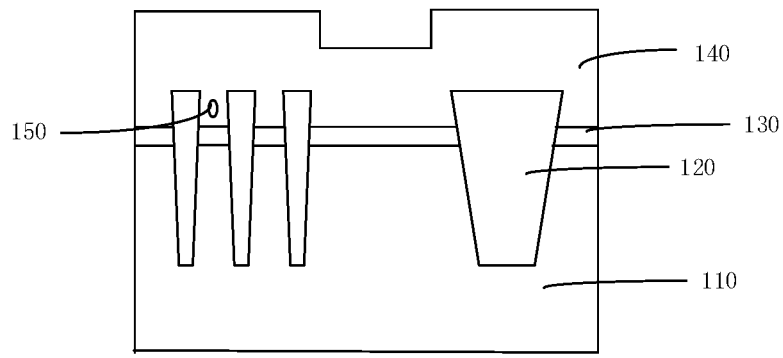
Figure 3:
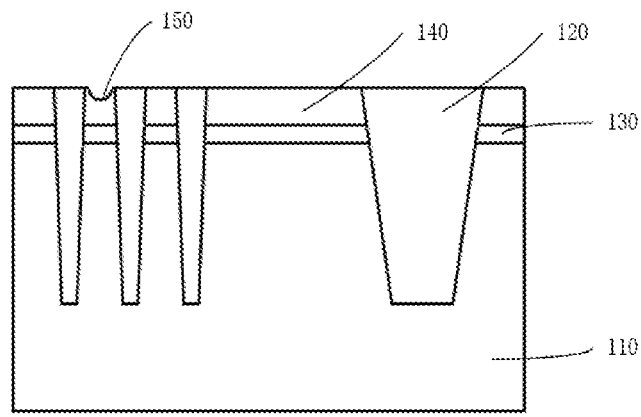
Figure 4:
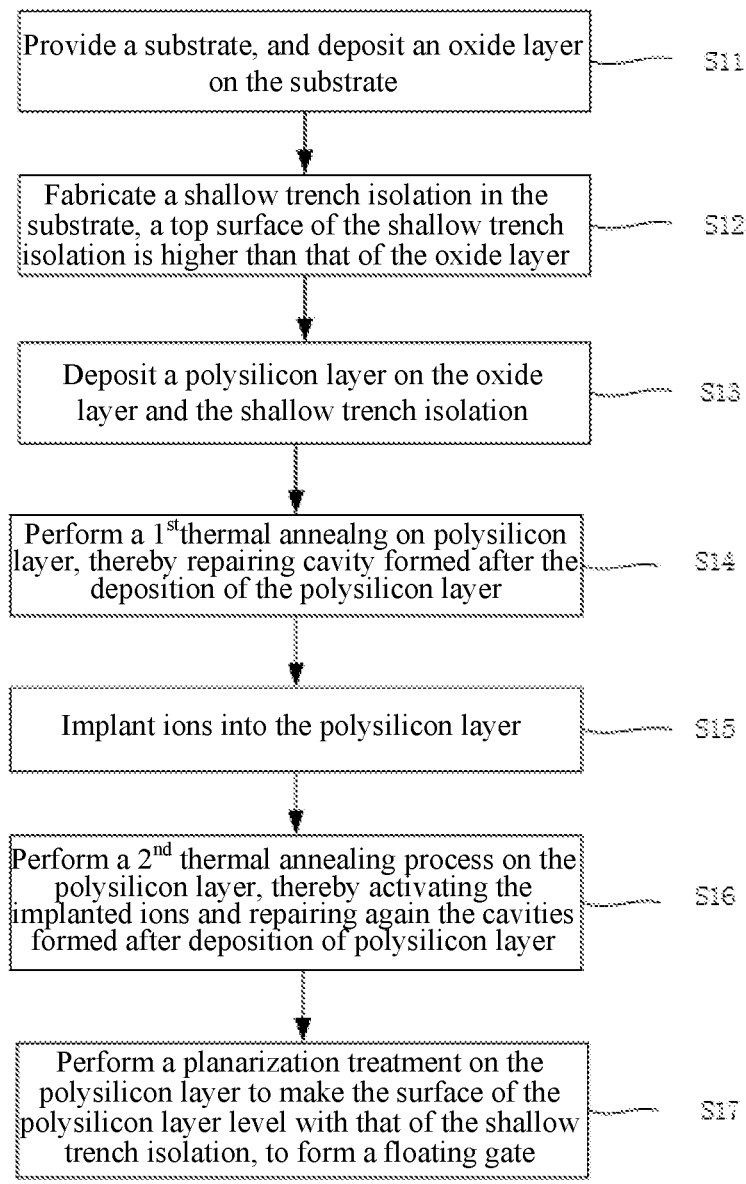
FIG. 4 is a flowchart of a floating gate fabrication method in an embodiment of the present invention.

The present invention provides a floating gate fabrication method. Refer to FIG. 4, which is a schematic flowchart of a floating gate fabrication method in an embodiment of the present invention. The floating gate fabrication method includes:

S11: providing a substrate, and depositing an oxide layer on the substrate;

S12: fabricating a shallow trench isolation on the substrate, the surface of the shallow trench isolation being higher than that of the oxide layer;

S13: depositing a polysilicon layer on the oxide layer and the shallow trench isolation;

S14: thermally annealing the polysilicon layer for the first time, to repair cavity(s) formed after deposition of the polysilicon layer;

S15: implanting ions into the polysilicon layer;

S16: thermally annealing the polysilicon layer for the second time, to activate the implanted ions and repair again the cavity(s) formed after deposition of the polysilicon layer; and S17: performing a planarization treatment on the polysilicon layer to form a floating gate.

A specific implementation of the present invention is described in detail below with reference to schematic cross-sectional diagrams FIGS. 5 to 9.

Figure 5:
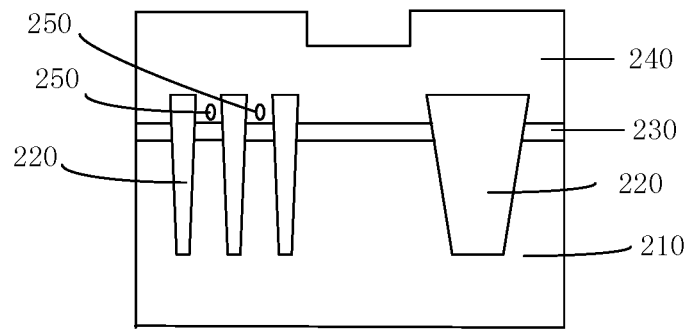
FIG. 5 to FIG. 9 are schematic cross-sectional diagrams of the floating gate fabrication method in an embodiment of the present invention.

In step S11, referring to FIG. 5, a substrate 210 is first provided, where a wafer may be selected as the substrate 210. Then, an oxide layer 230 is deposited on the surface of the wafer. As a gate oxide layer of a floating gate memory, the oxide layer 230 may be made from silicon oxide. The deposited oxide layer 230 is 80 to 120 angstroms thick, for example, the oxide layer 230 may be 100 angstroms thick. A method for depositing the oxide layer 230 may be chemical vapor deposition.

Further, in step S12, referring to FIG. 5 continuously, a plurality of shallow trench isolations 220 are fabricated on the wafer, to isolate devices. The surface of each shallow trench isolation 220 is higher than that of the oxide layer 230. A fabrication method of the shallow trench isolations 220 may be as follows: First, an auxiliary layer made from silicon nitride is formed on the oxide layer 230. Then, photolithography and dry etching are performed on the auxiliary layer, the oxide layer, and the substrate to form pre-defined trenches, and oxide is used to fill the trenches by means of chemical vapor deposition, where the oxide may be silicon dioxide. Subsequently, a planarization treatment is carried out by means of chemical mechanical polishing. Finally, the auxiliary layer is eliminated to complete fabrication of the shallow trench isolations 220.

Figure 6:
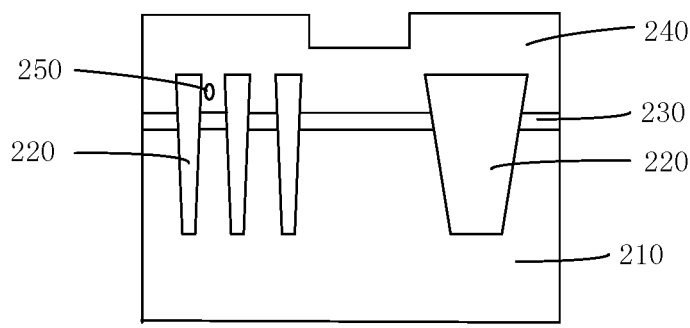

Further, in step S13, referring to FIG. 5 and FIG. 6 together, after deposition of the oxide layer 230, a polysilicon layer 240 is deposited on the oxide layer 230. A method for depositing the polysilicon layer 240 may also be chemical vapor deposition. Specifically, the polysilicon layer 240 is formed after chemical reaction of silane $SiH_4$ at the temperature of 600° C. to 650° C. However, inventors find that cavity(s) 250 may occur in the deposited polysilicon layer 240 in this step. The cavity(s) 250 in the polysilicon layer 240 probably causes a depression in a floating gate subsequently formed by polishing, and the depression in the floating gate may affect reliability and a storage function of a device. Therefore, a step of repairing the cavity(s) 250 in the polysilicon layer 240 is added in the subsequent process, making the finally formed floating gate to have no defect.

Figure 7:
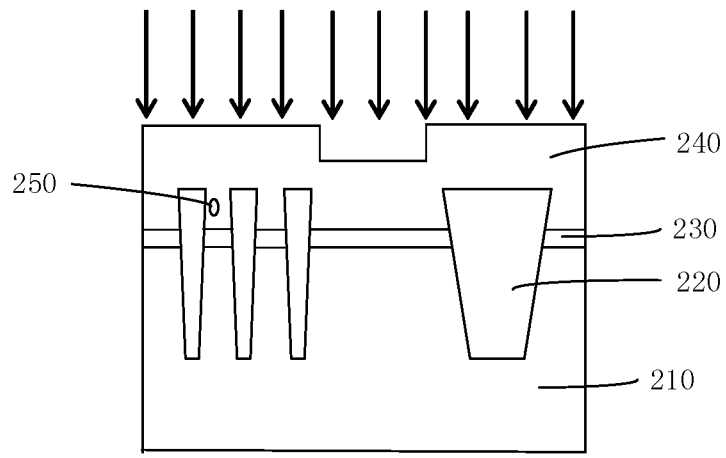

Further, in step S14, referring to FIG. 7, after the polysilicon layer 240 is deposited on the surface of the oxide layer 230, the polysilicon layer 240 is thermally annealed for the first time. Specifically, in nitrogen gas atmosphere, the nitrogen gas is heated up to 1000° C. to 1080° C., and the thermal annealing lasts for 20 to 30 seconds. For example, the thermal annealing may last for 20 seconds during which the polysilicon layer 240 crystallizes once again. The cavity (s) 250 formed in the polysilicon layer 240 in the previous step can be partially or entirely eliminated by the first thermal annealing step.

Further, in step S15, referring to FIG. 7 continuously, after the polysilicon layer 240 undergoes the first thermal annealing step, N ions are implanted into the polysilicon layer 240. In this embodiment, phosphonium ions may be implanted into the polysilicon layer 240. The polysilicon layer 240 has a doping level of $1E15/cm^2$ to $5E15/cm^2$, for example, $1E15/cm^2$, $3E15/cm^2$, or $5E15/cm^2$, after implantation of the phosphonium ions.

Figure 8:
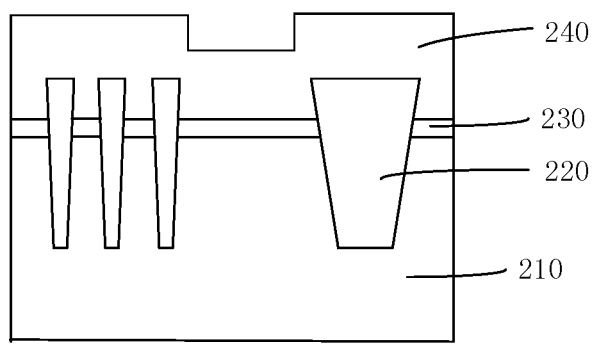

Further, in step S16, referring to FIG. 8, after the implantation of the phosphonium ions into the polysilicon layer 240, the polysilicon layer 240 is thermally annealed for the second time. The second thermal annealing step is still performed in pure nitrogen gas atmosphere, in which the nitrogen gas is heated up to 1000° C. to 1080° C., and the thermal annealing still lasts for 20 to 30 seconds, for example, for 20 seconds. In the second thermal annealing step, the phosphonium ions implanted into the polysilicon layer 240 can be activated, and further the cavity(s) that has not yet been completely repaired in the polysilicon layer 240 can be repaired.

Figure 9:
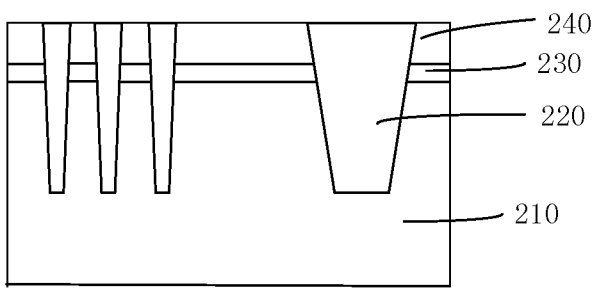

Further, in step S17, referring to FIG. 9, after the second thermal annealing step is finished, the cavity(s) in the polysilicon layer 240 can be completely repaired by the first and second thermal annealing steps. Then, the polysilicon layer 240 is chemically-mechanically polished to a desired height, to form the floating gate. In different floating gate structures, the polysilicon layer 240 is polished so that its surface is level with the surface of the shallow trench isolation 220, to finally form the floating gate. In the embodiment of the present invention, the polished floating gate is about 200 to 600 angstroms high, for example, the floating gate may be 200, 400 or 600 angstroms high.

To sum up, in the floating gate fabrication method provided by the embodiment of the present invention, a substrate is provided, and an oxide layer is deposited on the substrate; a shallow trench isolation is fabricated on the substrate; a polysilicon layer is deposited on the oxide layer; thermal annealing is performed for the first time, to repair a cavity formed after deposition of the polysilicon layer; ions are implanted into the polysilicon layer, and thermal annealing is performed for the second time, to activate the implanted ions and further repair the cavity formed after deposition of the polysilicon layer; and the polysilicon layer is chemically-mechanically polished so that its surface is level with the surface of the shallow trench isolation, to form the floating gate. After deposition of the polysilicon layer, the cavity formed in the polysilicon layer can be repaired by the first thermal annealing step. Then, the thermal annealing is performed for the second time after ion implantation into the polysilicon layer. The second thermal annealing step not only can activate the implanted ions, but also can further repair the cavity in the polysilicon layer, thus avoiding the cavity from affecting the performance of the floating gate.

The above merely describes a preferred embodiment of the present invention, but does not impose any limitation on the present invention. Any equivalent changes or modifications made by persons skilled in the art to the technical solutions and technical contents disclosed in the present invention without departing from the technical scope of the present invention all belong to the technical content of the present invention and fall within the protection scope of the present invention.

What is claimed is:

1. A floating gate fabrication method, comprising the following steps in the sequence set forth:
    providing a substrate, and depositing an oxide layer on the substrate;
    fabricating a shallow trench isolation in the substrate, a top surface of the shallow trench isolation being higher than a top surface of the oxide layer;
    depositing a polysilicon layer on the oxide layer and the shallow trench isolation;
    performing a first thermal annealing process on the polysilicon layer, thereby repairing cavities formed after the deposition of the polysilicon layer;
    implanting ions into the polysilicon layer on which the first thermal annealing process has been performed;
    performing a second thermal annealing process on the same polysilicon layer, thereby activating the implanted ions and repairing again the cavities formed after the deposition of the polysilicon layer; and
    planarizing the polysilicon layer to form a floating gate.

2. The floating gate fabrication method of claim 1, wherein the step of fabricating a shallow trench isolation comprises:
    depositing an auxiliary layer on the surface of the oxide layer;
    dry etching the auxiliary layer, the oxide layer, and the substrate to form a trench, filling the trench with oxide, and then planarizing the oxide by chemical mechanical polishing; and
    removing the auxiliary layer to form the shallow trench isolation.

3. The floating gate fabrication method of claim 1, wherein the oxide layer deposited on the substrate comprises silicon oxide.

4. The floating gate fabrication method of claim 1, wherein the oxide layer deposited on the substrate has a thickness of 80 to 120 angstroms.

5. The floating gate fabrication method of claim 1, wherein the step of depositing a polysilicon layer comprises: depositing the polysilicon layer by chemical vapor deposition at a temperature of 600° C. to 650° C.

6. The floating gate fabrication method of claim 1, wherein the first thermal annealing process and the second thermal annealing process are both performed in a nitrogen gas atmosphere at a temperature of 1000° C. to 1080° C.

7. The floating gate fabrication method of claim 6, wherein the first thermal annealing process and the second thermal annealing process are both performed for 20 to 30 seconds.

8. The floating gate fabrication method of claim 1, wherein the ions implanted into the polysilicon layer comprise phosphonium ions.

9. The floating gate fabrication method of claim 8, wherein the polysilicon layer has a doping concentration of $1E15/cm^2$ to $5E15/cm^2$ after implantation of the phosphonium ions.

10. The floating gate fabrication method of claim 1, wherein the polysilicon layer is planarized until a top surface of the polysilicon layer levels with the top surface of the shallow trench isolation.

11. The floating gate fabrication method of claim 1, wherein the floating gate has a height of 200 to 600 angstroms after the planarization.

* * * * *